(12) United States Patent
Shih

(10) Patent No.: US 6,561,680 B1
(45) Date of Patent: May 13, 2003

(54) LIGHT EMITTING DIODE WITH THERMALLY CONDUCTIVE STRUCTURE

(76) Inventor: Kelvin Shih, 903 Devonshire Blvd., Brighton, MI (US) 48116

( * ) Notice: Subject to any disclaimer, the term of this patent is extended or adjusted under 35 U.S.C. 154(b) by 0 days.

(21) Appl. No.: 09/711,979

(22) Filed: Nov. 14, 2000

(51) Int. Cl.[7] ............................................... F21V 29/00
(52) U.S. Cl. ....................... 362/294; 362/800; 362/545; 313/512
(58) Field of Search ................................. 362/800, 545, 362/294; 313/512, 112

(56) References Cited

U.S. PATENT DOCUMENTS

| | | | | |
|---|---|---|---|---|
| 4,267,559 A | | 5/1981 | Johnson et al. ................ 357/81 |
| 4,920,404 A | * | 4/1990 | Shrimali et al. ........... 174/52.2 |
| 4,935,665 A | * | 6/1990 | Murata ........................ 313/500 |
| 5,119,174 A | * | 6/1992 | Chen ............................ 362/800 |
| 5,173,839 A | * | 12/1992 | Metz, Jr. ..................... 361/387 |
| 5,857,767 A | | 1/1999 | Hochstein |
| 6,274,924 B1 | * | 8/2001 | Carey et al. ................. 257/676 |
| 6,428,189 B1 | * | 8/2002 | Hochstein ................... 363/373 |

* cited by examiner

Primary Examiner—Sandra O'Shea
Assistant Examiner—Guiyoung Lee
(74) Attorney, Agent, or Firm—Carlson Gaskey & Olds PC

(57) ABSTRACT

A light emitting diode (LED) designed to be used in conjunction with a heat sink includes an anode portion and a cathode portion formed from a thermally conductive material. The anode and cathode portions have a relatively large surface area to allow efficient heat dissipation. The cathode portion has a reflector cup formed thereon for supporting an LED chip. The LED structure allows the LED junction temperature to remain low, even as the LED chip is driven with higher currents, thereby allowing the LED to generate a higher light output without adverse temperature-related effects.

12 Claims, 7 Drawing Sheets

LIGHT EMITTING DIODE WITH THERMALLY CONDUCTIVE STRUCTURE

TECHNICAL FIELD

The invention relates to light emitting diodes having a heat management system, and more particularly to a light emitting diode having a thermally-conductive structure for dissipating heat.

BACKGROUND OF THE INVENTION

Light emitting diodes (LED) have been available since the early 1960's. Because of the relatively high efficiency of LEDs, LED usage has greatly increased in popularity in all types of applications. Recent developments in making high temperature and high brightness LEDs have expanded the use of LEDs from signs and message boards to automobile interior and exterior lights and even traffic signals. Even with new high-temperature LED technology, however, LEDs still exhibit a substantial decrease in light output when the temperature of the LED junction increases. For example, an increase of 75° C. at the junction temperature may cause the level of luminous flux to be reduced to one-half of its room temperature value. This phenomenon limits the amount of output from conventional LEDs.

LEDs are often encapsulated in an optically clear epoxy resin, which is a poor thermal conductor. Because of the epoxy's poor thermal conductivity, very little heat can dissipate from the LED through the optical epoxy. This restriction places a severe limit on the drive current that can be used to drive the LEDs because any excess current would exceed the temperature limitations of the LED and result in a decrease in light output.

In addition, commonly used epoxy resins have a glass transition temperature at which the resin transforms from a rigid, glass-like solid to a rubbery material. A dramatic change in the coefficient of thermal expansion of the LED is generally associated with the glass transition temperature. This may cause a mechanical failure in the LED (e.g., components of the LED may separate) or cause the bounding wire in the LED to break.

For LEDs having low thermal resistance, the relative flux increases almost proportionally to the forward current. However, for LEDs having high thermal resistance, which describes most LEDs in use today, relative flux can actually decrease as forward current is increased. For LEDs with high thermal resistance, a great deal of heat accumulates in the LED, resulting in high LED junction temperatures. In these cases, the effects of increasing junction temperature can offset the effects of increased forward current, causing the LED to maintain or even lower its light output level even with increases in the forward current due to the LED's rising junction temperature.

There have been some attempts to create an LED structure that has more efficient heat dissipation so that higher forward currents will increase, rather than decrease, the LED's light output. U.S. Pat. No. 5,857,767 to Hochstein discloses a way to mount LEDs to a heat sink with an electrically conductive epoxy. This structure does allow LEDs to be driven with more current than conventional structures while maintaining low junction temperatures, thereby allowing increased light output. However, there are not many LEDs that are compatible with the Hochstein structure because most the LEDs use a lead frame to support the LED chip as well as to make electrical connections. The structure of the lead frame requires any heat in the LED to conduct through long, narrow legs, making it difficult to remove any significant amount of heat from the LEDs junction.

There is a need for an LED structure that can dissipate heat quickly and efficiently so that the junction temperature of the LED can remain at a stable level even when the drive current of the LED is increased to increase light output.

SUMMARY OF THE INVENTION

Accordingly, an LED structure according to the invention constructs an anode portion and a cathode portion from thermally conductive material. An LED chip is supported by the cathode portion, allowing any generated heat from the LED chip to be carried away via the thermally conductive material. The inventive structure is preferably designed to couple with a heat sink for efficient thermal dissipation.

The inventive structure creates an LED having a larger cross-sectional area and a relatively short path between the LED chip and the heat sink, increasing the efficiency in which heat is directed away from the LED. The efficient heat removal properties of the inventive LED structure allows the LED junction temperature to be kept low even as the forward current through the LED chip is increased to increase light output from the single LED. As a result, the inventive LED structure allows the LED to be driven with a much larger current, allowing increased overall light output or allowing use of fewer LEDs to provide a given output.

DETAILED DESCRIPTION OF THE PREFERRED EMBODIMENTS

Figure 1A:
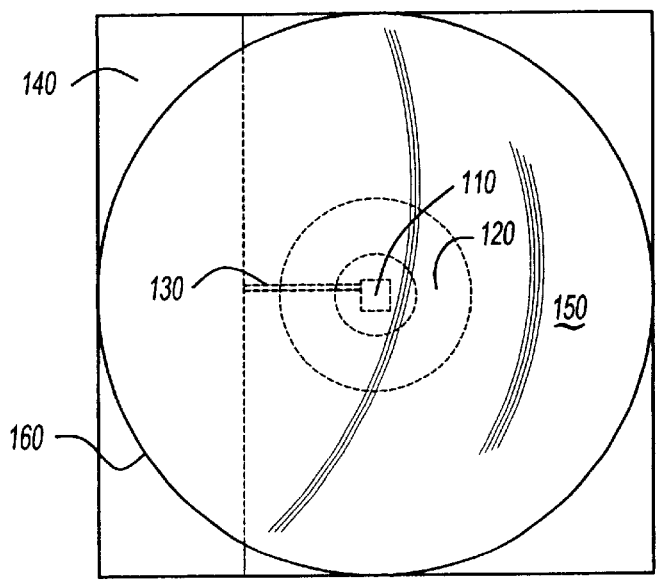
FIG. 1A is a top view of a first embodiment of the present invention.
Figure 1B:
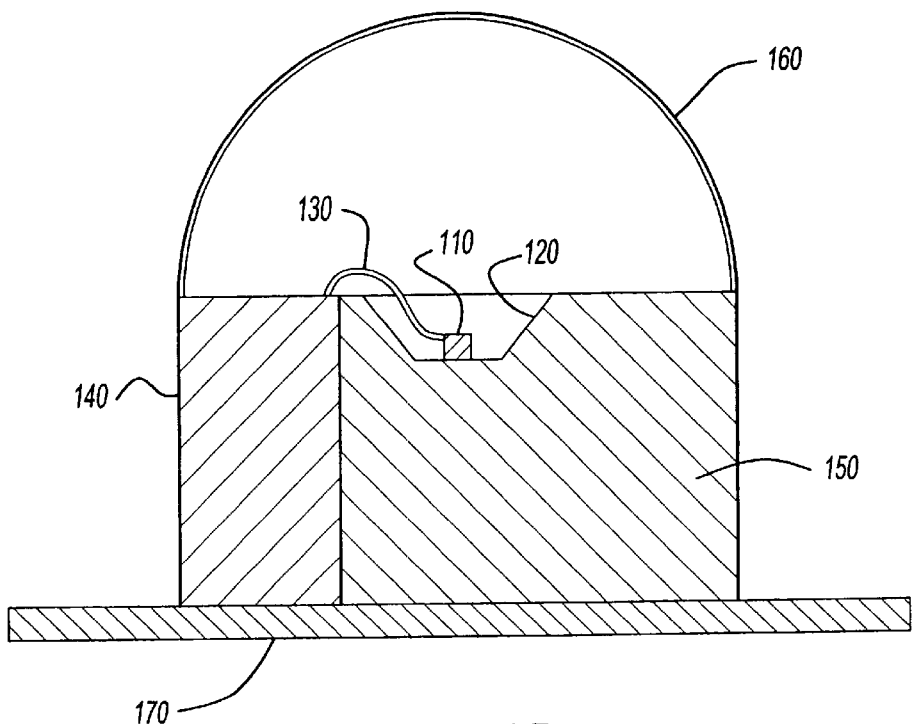
FIG. 1B is a side sectional view of the embodiment shown in FIG. 1 A.

FIGS. 1A and 1B are top and side sectional views, respectively, of an LED structure according to the present invention. is a LED structure having blocks made from a thermally conductive material, such as copper, aluminum, or other material. An anode block 140 and a cathode block 150 are joined together with an electrically non-conductive adhesive. A reflector cup 120 is machined on to the cathode block 150. An LED chip 110 is then placed in the reflector cup 120. A bounding wire 130 connects an anode pad on the LED chip 110 to the anode block 140. A lens 160 directs the light output from the LED chip 110 to the outside world. The LED structure can be coupled to a heat sink 170 made out aluminum or another thermally-conductive material to pull the heat away from the LED structure to the ambient air.

Figure 2A:
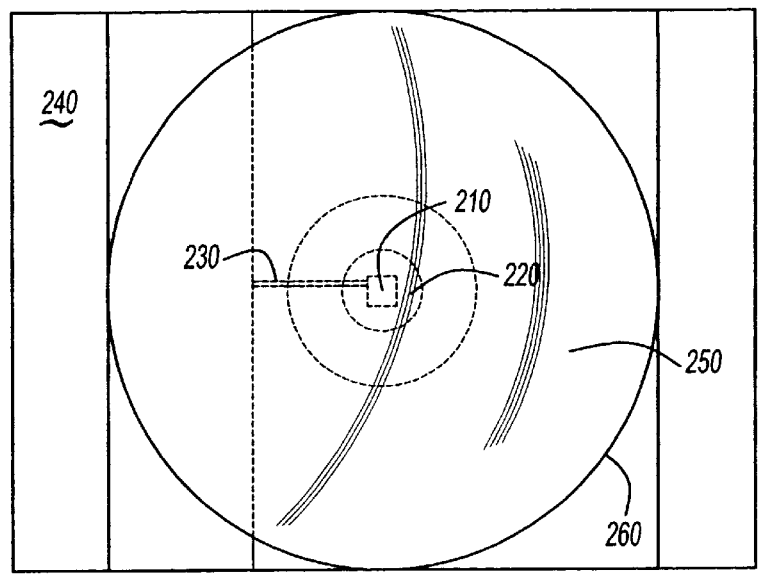
FIG. 2A is a top view of a second embodiment of the present invention.
Figure 2B:
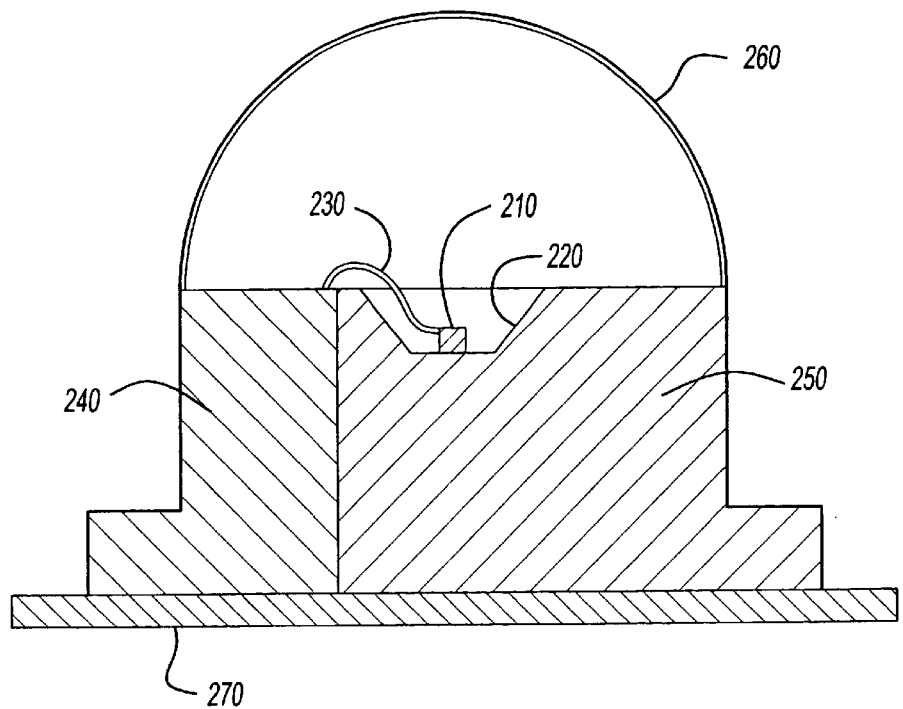
FIG. 2B is a side sectional view of the embodiment shown in FIG. 2A.
Figure 4A:
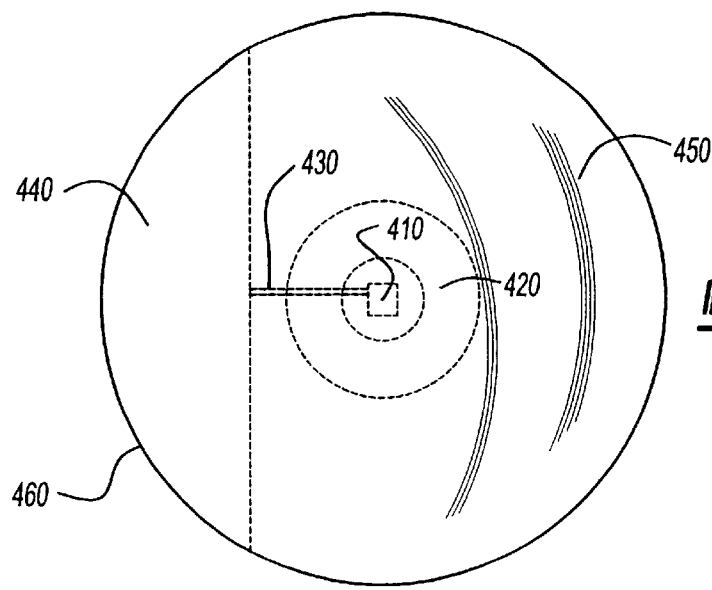
FIG. 4A is a top view of a fourth embodiment of the present invention.
Figure 4B:
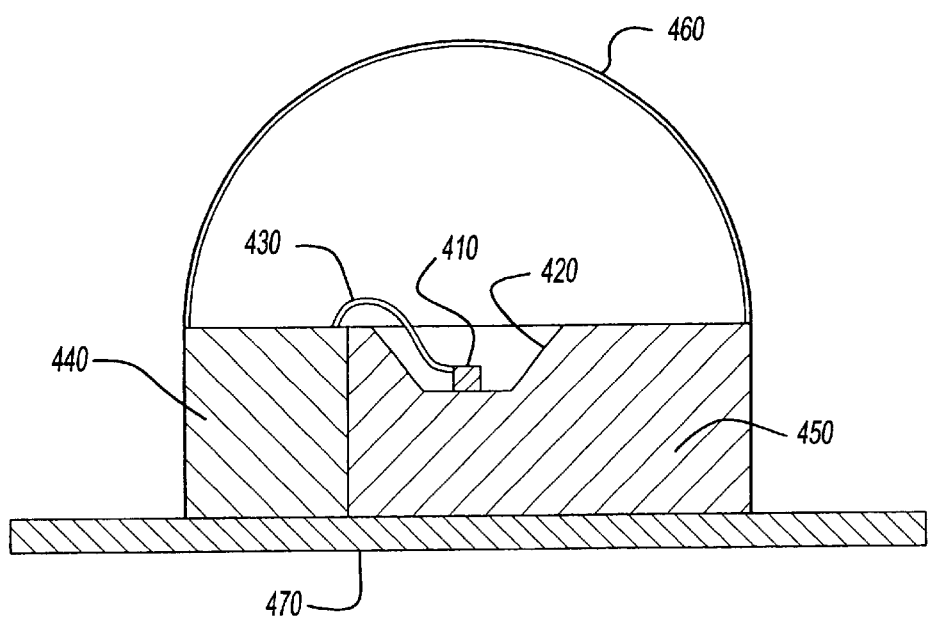
FIG. 4B is a side sectional view of the embodiment shown in FIG. 4A.

FIGS. 2A and 2B illustrate an alternative LED structure similar to the structure shown in FIGS. 1A and 1B. In this alternative structure, the anode block 240 and cathode block 250 have extended feet to provide more stable footing. FIGS. 4A and 4B also illustrate an embodiment using an anode block 440 and a cathode block 450, but having an overall structure that has a cylindrical cross-section rather than a rectangular or square cross-section. Of course, the anode block 440 and cathode block 450 can have any shape and cross-section without departing from the scope of the invention; the only requirement is that the blocks are to be electrically isolated from each either, either by non-conductive adhesive or some other means, that the LED chip is disposed on the cathode portion and electrically coupled to the anode portion, and that the anode portion and cathode portion are able to be coupled to a heat sink.

Figure 3A:
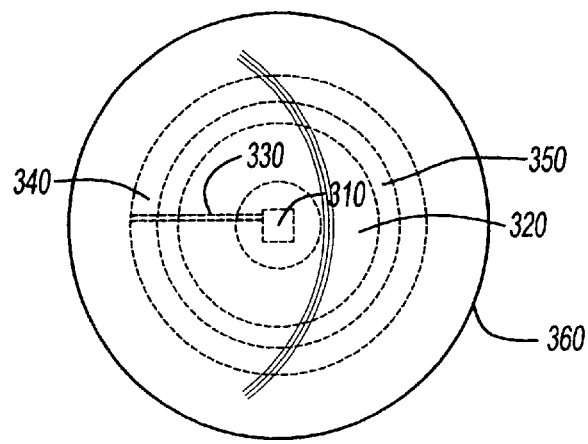
FIG. 3A is a top view of a third embodiment of the present invention.
Figure 3B:
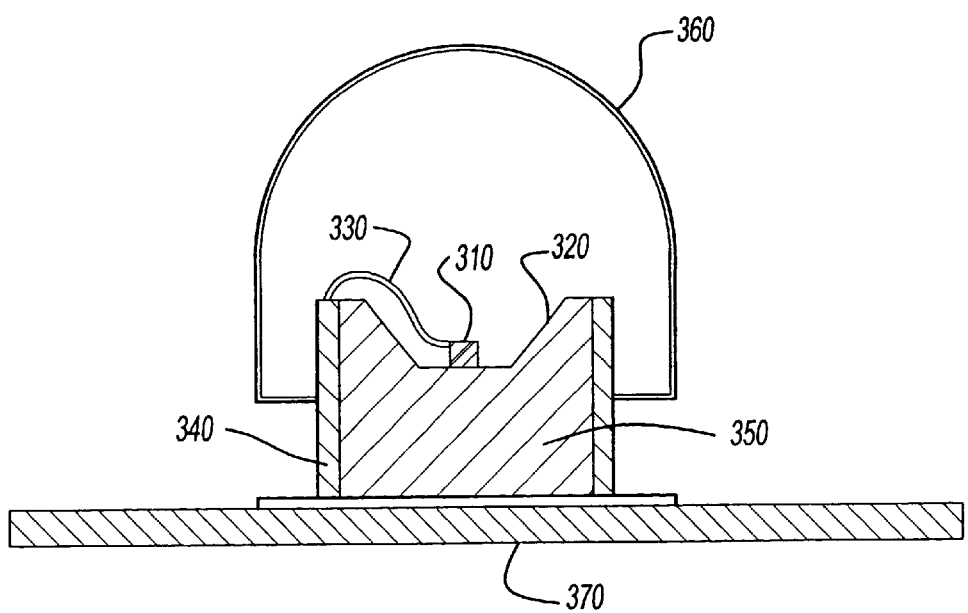
FIG. 3B is a side sectional view of the embodiment shown in FIG. 3A.

FIGS. 3A and 3B illustrate yet another alternative LED structure. In this embodiment, the anode portion 340 is in the form of a tube that surrounds a cylindrical cathode portion 350. Note that although FIGS. 3A and 3B show an LED structure with a circular cross-section, the LED can have any cross-sectional shape without departing from the scope of the invention. As in the embodiments described above, electrically non-conductive adhesive separates the anode portion 340 and cathode portion 350. All of the other components in the structure are the same as in the previously described embodiment.

Figure 5A:
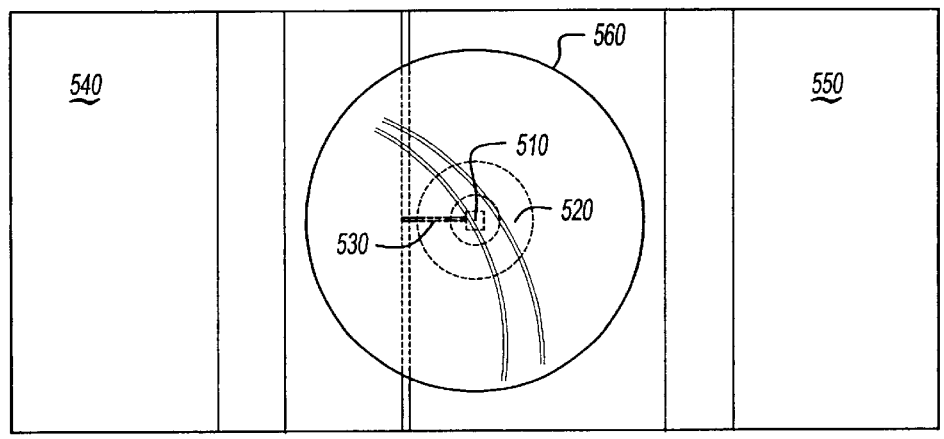
FIG. 5A is a top view of a fifth embodiment of the present invention.
Figure 5B:
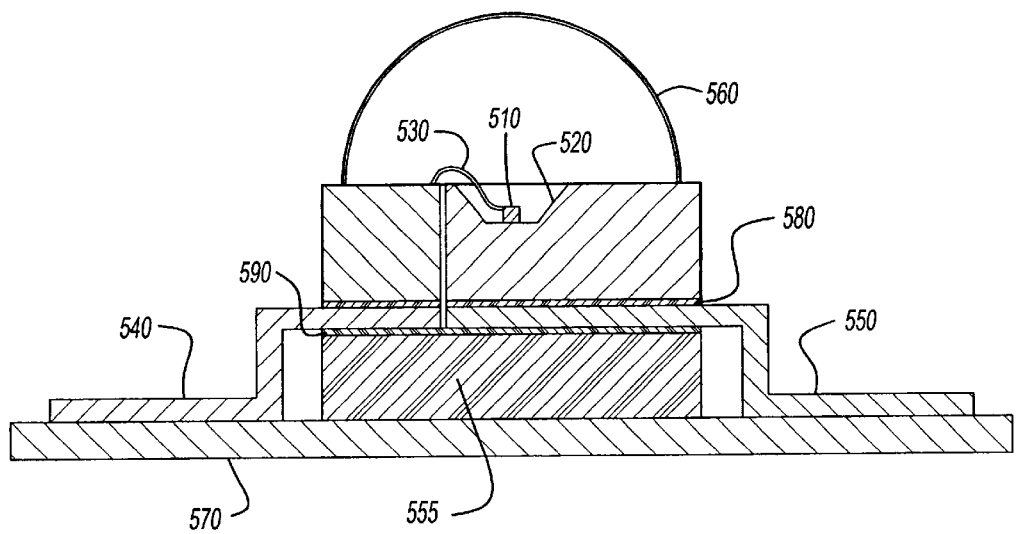
FIG. 5B is a side sectional view of the embodiment shown in FIG. 5A.

FIGS. 5A and 5B illustrate an LED made out of thermally conductive strips. More particularly, the anode portion strip 540 and cathode portion strip 550 can be formed from one single strip of material. In this example, the structure is formed from a thin metal strip having two thicker, shorter metal strips, one thick strip bonded on each surface of the thinner strip. The top surface of the thin strip and one of the thicker strips are bonded with electrically conductive adhesive, while the bottom surface and the other thicker strip are bounded with electrically non-conductive adhesive. After these strips are bonded together, a saw is used to cut through the top thick strip and the thin strip, but not the bottom thick strip, to form the anode portion 540 and the cathode portion 550 simultaneously. The reflector cup 520 is machined on to the cathode portion and the LED chip 510 is placed in the reflector cup 520. A support block 555, formed by the bottom thick strip, acts as the support for the cathode portion 550 and anode portion 540 when the LED structure is being manufactured to prevent the components of the LED structure from separating. After the LED structure is complete, the support block 555 also provides a direct conduction path between the LED chip 510 and the heat sink 570. All of the other components in the structure are the same as in the previously described embodiments.

Figure 6A:
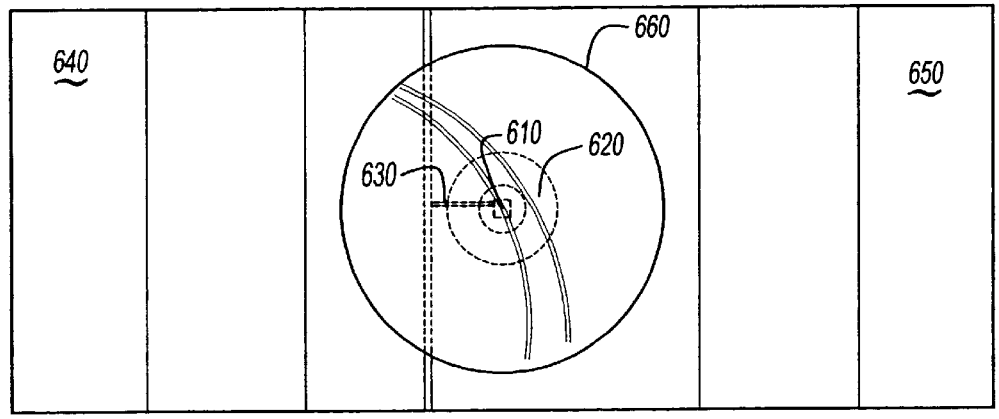
FIG. 6A is a top view of a sixth embodiment of the present invention.
Figure 6B:
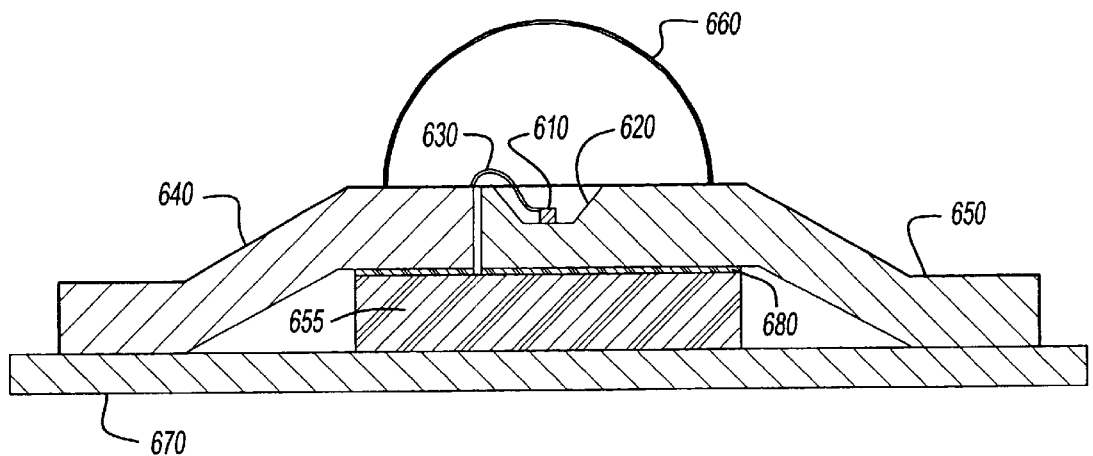
FIG. 6B is a side sectional view of the embodiment shown in FIG. 6A.

FIGS. 6A and 6B shows an alternative embodiment of an LED constructed from thermally conductive metal strips. Like the previously described embodiment, the anode portion 640 and the cathode portion 650 in this embodiment can be constructed from a single strip of material. In this case, a thick strip is bonded to the surface of a shorter, thick strip with non-conductive adhesive. After these strips are bonded together, a saw is used to cut through the top thick strip and the thin strip, but not the bottom thick strip, to form the block-shaped anode portion 640 and the cathode portion 650 simultaneously. The reflector cup 520 is machined on to the cathode portion and the LED chip 510 is placed in the reflector cup 520. A support block 655, formed by the bottom thick strip, acts as the support for the cathode portion 650 and anode portion 640 when the LED structure is being manufactured to prevent the components of the LED structure from separating. All of the other components in the structure are the same as in the previously described embodiments.

Figure 7A:
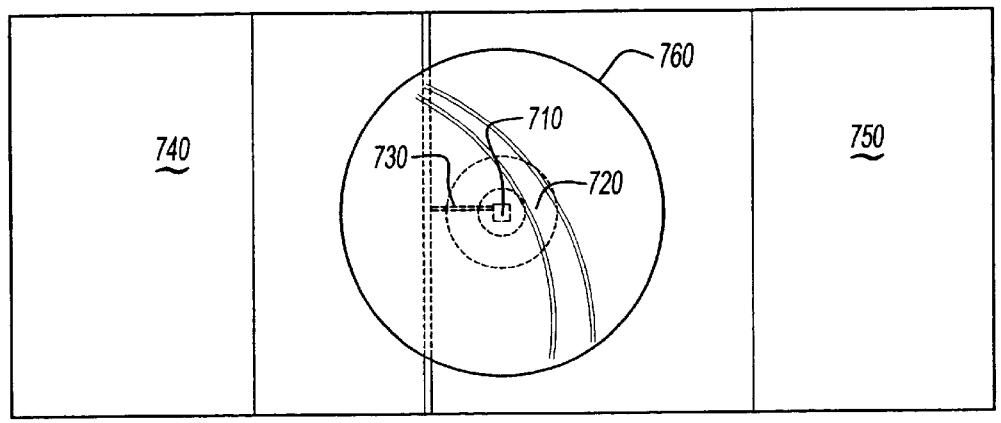
FIG. 7A is a top view of a seventh embodiment of the present invention.
Figure 7B:
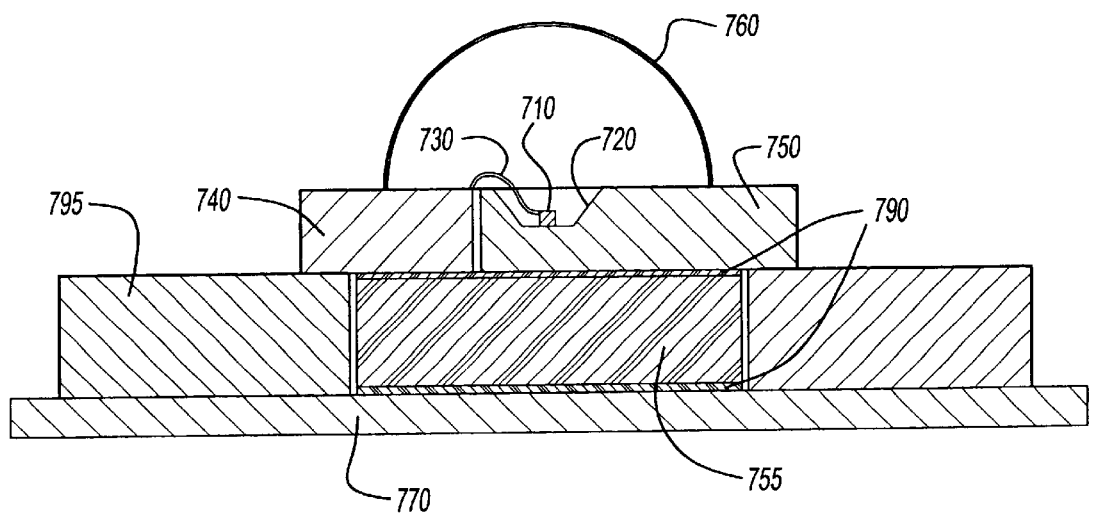
FIG. 7B is a side sectional view of the embodiment shown in FIG. 7A.

FIGS. 7A and 7B illustrate an alternative LED structure that is shown in conjunction with a printed circuit board 795. The structure in FIGS. 7A and 7B is also an LED formed from strips of thermally conductive material. More particularly, a thick strip is bonded to the surface of another thick strip with non-conductive adhesive. After these strips are bonded, a saw is used to cut through the top thick strip. This way both the anode 740 & cathode 750 are formed at the same time. The reflector cup 720 is machined on to the cathode 750. The LED chip 710 is then placed in the reflector cup 720. A support block 755, formed by the bottom thick strip, acts as the support for the cathode portion 750 and anode portion 740 when the LED structure is being manufactured to prevent the components of the LED structure from separating. All of the other components in the structure are the same as in the previously described embodiments.

To mount the LED structure onto the printed circuit board 795, a hole is cut below the LED so that the support block 755 can extend all the way through the printed circuit board 795 and contact the heat sink 770.

The inventive LED structure can be used in application where there ordinarily would not be enough space to replace an incandescent light bulb with an LED cluster with the same light output as the bulb or where conventional LED structures would not be able to provide enough light output without adverse temperature effects due to inadequate heat dissipation. Some possible applications include reading lights on commercial airplanes, outdoor signs/message boards that need to be viewed in daylight (thereby requiring higher light outputs than signs to be read at night), and applications requiring long LED life. Because the inventive LED structure has a lower thermal resistance than conventional LEDs, the life span of the inventive LED structure can be 5 to 30 or more times longer than known LEDs. Note that due to the structure of the inventive LEDs, they may require electrically conductive epoxy for attachment to a circuit board.

It should be understood that various alternatives to the embodiments of the invention described herein may be employed in practicing the invention. It is intended that the following claims define the scope of the invention and that the method and apparatus within the scope of these claims and their equivalents be covered thereby.

What is claimed is:

1. A light emitting diode, comprising:
 a block-shaped thermally conductive anode portion;
 a block-shaped thermally conductive cathode portion, wherein the anode portion and the cathode portion are electrically isolated from each other; and
 a light-emitting diode chip disposed on the cathode portion and electrically coupled to the anode portion,
 wherein the anode portion and the cathode portion are designed to be thermally coupled to a heat sink.

2. The light emitting diode of claim 1, further comprising an electrically non-conductive adhesive layer in between the anode portion and the cathode portion.

3. The light emitting diode of claim 1, further comprising a supporter disposed underneath the anode portion and the cathode portion.

4. The light emitting diode of claim 1, wherein the anode portion surrounds the cathode portion.

5. The light emitting diode of claim 4, wherein the cathode portion is in the form of a cylinder and the anode portion is in the form of a tube.

6. The light emitting diode of claim 1, wherein at least one of the anode portion and cathode portion are in the form of a strip, and wherein the light-emitting diode further includes a supporter disposed underneath the anode portion and cathode portion.

7. The light emitting diode of claim 1, wherein at least one of the anode portion and cathode portion includes a strip portion and a block portion, wherein the light-emitting diode chip is disposed on the block portion of the cathode portion, and wherein the light-emitting diode further includes a supporter disposed underneath the anode portion and cathode portion.

8. A light emitting diode, comprising:

a block-shaped thermally conductive anode portion;

a block-shaped thermally conductive cathode portion, wherein the anode portion and the cathode portion are electrically isolated from each other and coupled together with a non-electrically conductive material, the cathode portion having a concave reflecting area formed thereon;

a light-emitting diode chip disposed in the reflecting area and electrically coupled to the anode portion, wherein the anode portion and the cathode portion are designed to be thermally coupled to a heat sink.

9. The light emitting diode of claim 8, further comprising a supporter disposed under the anode portion and cathode portion.

10. The light emitting diode of claim 8, wherein the anode portion surrounds the cathode portion.

11. The light emitting diode of claim 8, wherein at least one of the anode portion and the cathode portion is an elongated block shape forming a strip, and wherein the light-emitting diode further includes a supporter disposed underneath the strip between the anode portion and the cathode portion.

12. The light emitting diode of claim 11, further comprising at least one strip portion disposed beneath at least one of the anode portion and the cathode portion, wherein the cathode portion includes the reflecting area in which the light-emitting chip is disposed.

* * * * *